United States Patent [19]

Pradal

[11] Patent Number: 5,075,651
[45] Date of Patent: Dec. 24, 1991

[54] VHF WIDE-BANDWIDTH LOW IMPEDANCE MONOLITHIC CRYSTAL FILTER HAVING BRIDGED ELECTRODES

[75] Inventor: Bortolo M. Pradal, Palatine, Ill.

[73] Assignee: Motorola, Inc., Schaumburg, Ill.

[21] Appl. No.: 480,682

[22] Filed: Feb. 15, 1990

[51] Int. Cl.$^5$ .............................................. H03H 9/56
[52] U.S. Cl. .................................... 333/187; 333/191; 310/366
[58] Field of Search .............................. 333/187-192; 310/320, 361, 366

[56] References Cited

U.S. PATENT DOCUMENTS

| | | | |
|---|---|---|---|
| 3,487,318 | 12/1969 | Herrman | 333/191 X |
| 3,697,788 | 10/1972 | Parker et al. | 333/191 X |
| 3,838,366 | 9/1974 | Coussot | 333/192 |
| 4,581,556 | 4/1986 | Yamamoto | 310/366 X |

FOREIGN PATENT DOCUMENTS

| | | | |
|---|---|---|---|
| 640420 | 12/1978 | U.S.S.R. | 333/187 |
| 849443 | 7/1981 | U.S.S.R. | 333/191 |
| 554789 | 7/1943 | United Kingdom | 310/366 |

Primary Examiner—Eugene R. LaRoche
Assistant Examiner—Benny Lee
Attorney, Agent, or Firm—Val Jean F. Hillman

[57] ABSTRACT

The present invention relates to a monolithic crystal filter having a passband of at least 30 Khz and a center frequency greater than 120 Mhz. This filter includes a piezoelectric substrate, a plurality of input electrodes conductively coupled together via a thin coupling bar, a plurality of output electrodes conductively coupled together via another thin coupling bar, and at least one common electrode disposed opposite to the plurality of input and output electrodes. The input and output electrodes are aligned on the substrate such that they electroacoustically couple along a crystallographic axes thereof. Multicoupling is provided along another crystallographic axes via the plurality of conductively coupled input and output electrodes, respectively. As a result of multicoupling, fifth overtone mode operation is now possible. In addition, the coupling bars, connecting the respective input and output electrode pluralities in parallel, reduce the filter's overall impedance without disrupting spurious response design parameters.

30 Claims, 2 Drawing Sheets

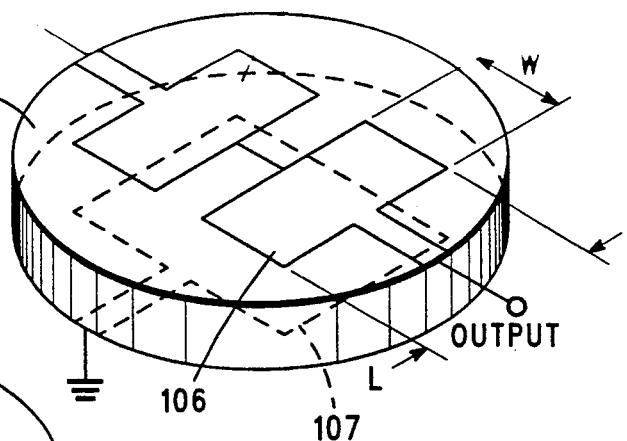
*FIG. 1*
— PRIOR ART —
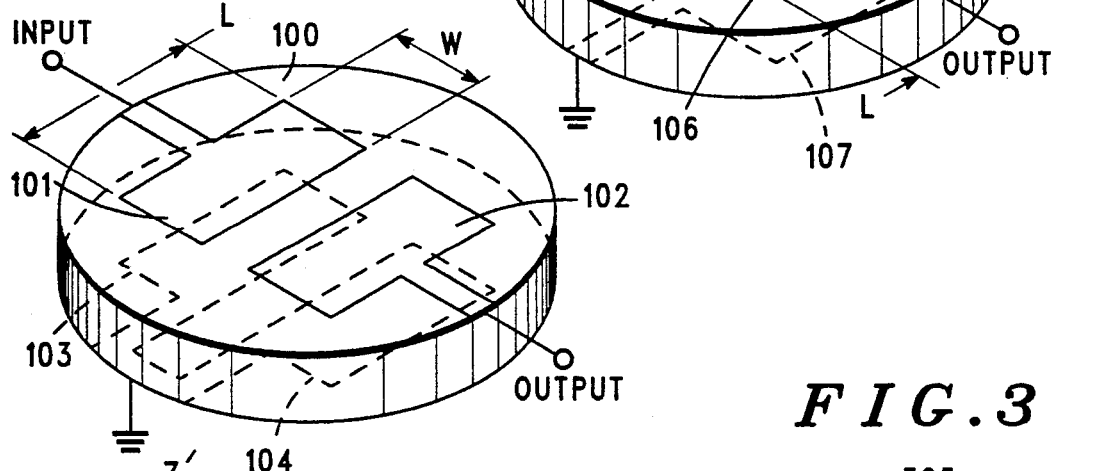
*FIG. 2*
— PRIOR ART —
*FIG. 3*
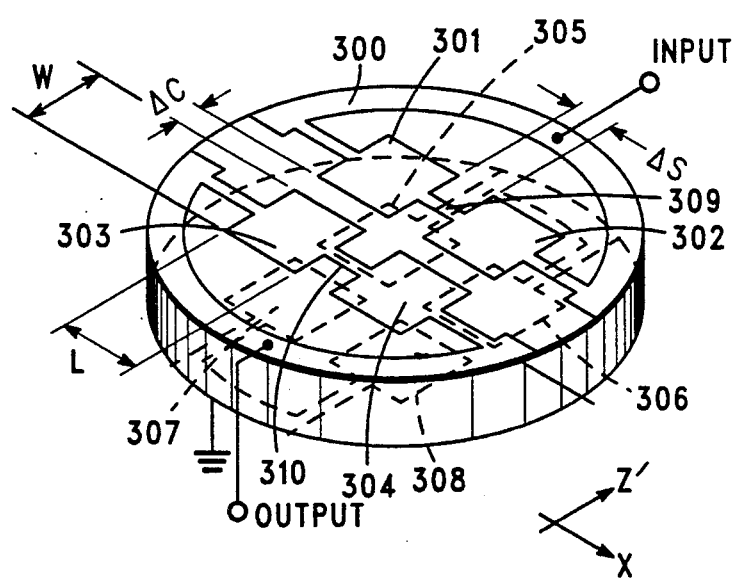
*FIG. 4*
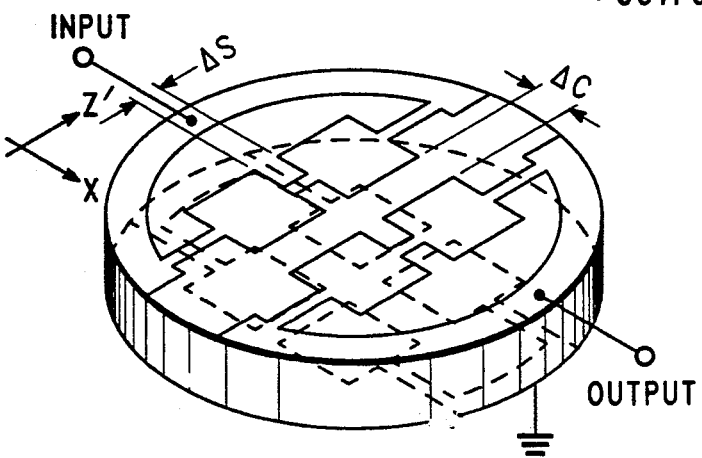

VHF WIDE-BANDWIDTH LOW IMPEDANCE MONOLITHIC CRYSTAL FILTER HAVING BRIDGED ELECTRODES

TECHNICAL FIELD

The present invention relates generally to filters, and more particularly to monolithic (e.g., coupled-dual resonator) crystal filters. This invention is specifically directed to wide-bandwidth monolithic crystal filters having low impedance and designed to operate at extraordinarily high center frequencies.

BACKGROUND OF THE INVENTION

Monolithic crystal filters are well known in the art. Such filters provide a bandpass filter transmission characteristic having a much higher quality factor (Q) than is attainable utilizing conventional capacitor and inductor components. In addition, monolithic crystal filters are available in exceedingly smaller structures than attainable in conventional bandpass filter designs.

It will be appreciated that monolithic crystal filters are developed using well-known deposition and etch Integrated Circuit (IC) manufacturing processes. The prior art monolithic crystal filters illustrated in FIGS. 1 and 2, are created by the deposition of shaped electrode structures on opposing sides of a quartz crystal wafer 100. These filters may include opposing pairs of electrodes 101, 103, and 102, 104 as in FIG. 2, or separate input and output electrodes 105 and 106, and a common electrode 107 per FIG. 1. The electrical characteristics of such monolithic crystal filters is generally described in an article by H. F. Tiersten entitled "Analysis of Trapped Energy Resonators Operating in Overtone of Coupled Thickness Shear and Thickness Twist", Journal of the Acoustic Society of America Vol. 59, pp. 879, 1976.

A basic generalization concerning the design and operation of a monolithic crystal filter is that the distance hereinafter referred to as the coupling gap between input and output electrodes is inversely proportional to the filter's bandwidth. Furthermore, the surface area and mass of the electrodes are determinative of the filter's center frequency of operation and inharmonic spurious filter response.

In addition, it is generally known that the surface area of an electrode greatly effects the filter's attenuation characteristics as well as the overall impedance of the monolithic crystal filter system. Unfortunately, the relationship between these differing parameters is hopelessly interrelated. Even minor alterations to one will typically effect some if not all of the important functional characteristics of the filter system design. Accordingly, optimal monolithic crystal filter design is as much an art as it is a science.

A recent trend in the art is to develop monolithic crystal filters that operate at exceedingly high frequencies. Accordingly, there exists a need for monolithic crystal filters capable of Intermediate Frequency (IF) filtering in the Very High Frequency (VHF) range. Such a filter should be designed to provide 5th order overtone operation at IF frequencies greater than 120 MHz. It should also possess a passband of at least 30 KHz, while maintaining a minimum of 50 dB attenuation of signals at least 75 KHz away from the passband center frequency, Fc.

In order to resonate at these high frequencies, the electrodes of the monolithic crystal filter must be designed to operate in the overtone mode of oscillation. This typically requires the selection of electrode and coupling gap sizes which provide the desired frequency of oscillation, while minimizing the magnitude of the filter's inharmonic spurious response. Such a filter will reject I.F. spurious signals in the upper frequency portion of the filter's stopband.

For general overtone operation, it has been established that optimal spurious response designs are dependent upon maintaining a specific ratio between the length (L) and the width (W) of the filter electrodes. For example, an optimal spurious response design for third overtone operation requires that the electrode $W/L = 1.047$. Fifth overtone optimal spurious rejection designs are described by $W/L = 1.145$, where the electrode's length (L) is the side of the electrode parallel to the coupling gap's axis of coupling. Unfortunately, conventional electrodes of sufficient mass, coupling gap width, and surface area to support VHF operation, as well as meet optimal spurious response design parameters, experience relatively high levels of impedance.

Because of radio frequency (RF) problems associated with high filter impedance at VHF frequencies, it is very desirable that monolithic crystal filters operating at these VHF frequencies have low impedence values. In addition, the requirements that these monolithic crystal filters provide impedance matching with the circuitry of the radio receivers in which they are typically employed further points out the need for low impedance filters.

It would therefore be extremely advantageous to provide a wide-bandwidth monolithic crystal filter capable of supporting IF filtering in the VHF range, that possesses both an optimal fifth overtone spurious response design, as well as low impedance.

SUMMARY OF THE INVENTION

Briefly described, the present invention is an improved wide-bandwidth monolithic crystal filter having a predetermined passband and passband center frequency. This filter includes a crystal wafer, a plurality of conductively coupled input electrodes having an input terminal, and disposed on the first surface of the wafer, plurality of conductively coupled output electrodes, having an output terminal, and disposed on the first surface of the wafer at a distance from the input electrodes, and a plurality of electrodes disposed on the second surface of the water in opposing relationship with said plurality of input electrodes and said plurality of output electrodes. The plurality of input electrodes conductively couple together via a first coupling bar, which is separate and apart from said input terminal. The plurality of output electrodes conductively couple together via a second coupling bar which is separate and apart from said output terminal. The plurality of input electrodes are electroacoustically coupled to the plurality of output electrodes across a coupling gap, $\Delta c$, therebetween. The plurality of input electrodes electroacoustically couple together across separation gaps, $\Delta s$, between each conductively coupled input electrode plurality. Similarly, the plurality of output electrodes electroacoustically couple together across separation gaps, $\Delta s$, between each conductively coupled output electrode plurality.

BRIEF DESCRIPTION OF THE DRAWINGS

FIG. 1 shows a prior art monolithic crystal filter;

FIG. 2 shows a different prior art monolithic crystal filter;

FIG. 3 shows a monolithic crystal filter embodying the present invention;

FIG. 4 shows another monolithic crystal filter embodying the present invention;

DETAILED DESCRIPTION OF THE PREFERRED EMBODIMENT

Figure 5:
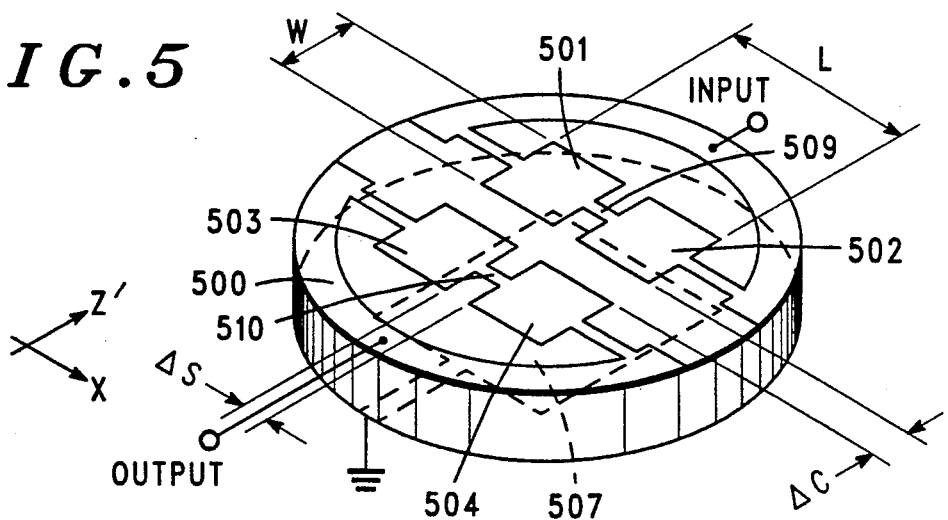
FIG. 5 shows still another monolithic crystal filter embodying the present invention.

FIG. 3 shows a monolithic crystal filter embodying the present invention. The filter includes a substrate 300 which is a piezoelectric material, such as quartz. It is well known that the thickness of the substrate 300 determines its fundamental and overtone resonating frequencies. According to the present invention, the substrate 300 is an AT cut quartz crystal, approximately 2.64 mils thick. This thickness is sufficient to support 5th overtone operation.

Disposed on the first surface of the substrate 300 is a plurality of input electrodes 301, 302 and a plurality of output electrodes 303, 304. Each electrode has an external lead or terminal, designated INPUT or OUTPUT, for connecting to other circuits in order to send and receive input and output signals, respectively. It will be appreciated that these electrodes are formed from an electrically conductive material, such as aluminum, which is deposited on the surface of the substrate at a desired thickness. In the preferred embodiment, each electrode is comprised of aluminum, deposited to a uniform thickness of 1500 Angstroms.

The monolithic crystal filter of FIG. 3 also includes a plurality of electrodes 305, 306, 307, and 308 disposed on the second surface of the wafer 300 in opposing relationship to the plurality of input and output electrodes disposed on the first surface. According to the preferred embodiment, the plurality of electrodes disposed on the second surface of the wafer are tied to a common ground and paired with the plurality of input and output electrodes on the first surface. In this fashion, the disclosed monolithic crystal employs input electrode pairs 301, 305 and 302, 306, and output electrode pairs 303, 307 and 304, 308, each adapted to resonate at substantially the passband center frequency. It will be appreciated by those skilled in the art that a modification to the lower surface interconnects may be achieved in order to obtain filter phase inversions.

According to FIG. 3 the plurality of input and output electrodes are substantially rectangular in shape. This shape readily permits electrode designs to approach the previously mentioned optimal spurious response ratios regarding electrode W/L. It will be appreciated, however, that electrodes may take the shape of any parallelogram where the opposite sides of each electrode are of the same length, since the spurious response is determined by the electrode dimension orthogonal to the axis of coupling.

From FIG. 3 it is clear that the wafer 300 has at least two crystallographic axes shown as "X" and "Z'". Such characteristics of a piezoelectric substrate are well known in the art and require no additional discussion. In FIG. 3, the plurality of input electrodes 301 and 302 are aligned with the sides designated L parallel to the "X" crystallographic axis of the wafer. In a similar fashion the plurality of output electrodes 303 and 304 are aligned the sides designated W parallel to the "X" crystallographic axis of the wafer. In addition, these sets of electrodes are arranged such that the plurality of input electrodes and the plurality of output electrodes are aligned with one another along the "Z'" crystallographic axis of the wafer. By intent, however, the plurality of input electrodes are separated from the plurality of output electrodes by coupling gap, $\Delta c$. Under the present embodiment, the plurality of input electrodes are electroacoustically coupled to the plurality of output electrodes across the coupling gap, i.e., along the "Z'" crystallographic axis of the wafer. The preferred embodiment suggests that the coupling gap be less than 4.0 mils wide. In this way the disclosed monolithic crystal filter will benefit from multicoupling.

Multicoupling is the summing effect of composite coupling along both the "X" and "Z'" axes of the wafer. It will be appreciated by those skilled in the art that multicoupling is desirable because it greatly enhances a monolithic crystal filter's bandwidth response. It is well established that increased bandwidth is realized due to the increased coupling resulting from the the combination of the individual couplings from each input electrode at the output electrode. For additional discussion on multicoupling, refer to U.S. Pat. No. 4,229,718 Arvanitis et al., and U.S. Pat. No. 4,329,666 Arvanitis, each assigned to the assignee of the present invention.

Multicoupling is achieved in the preferred embodiment along the "Z'" crystallographic axis via the coupling gap, $\Delta c$, and along the "X" crystallographic axis via a seperation gap, $\Delta s$, created between each electrode connected by a coupling bar. When viewed from above, coupling bar 309 connects input electrodes 301 and 302 along the "X" crystallographic axis of the wafer. Similarly, coupling bar 310 connects output electrodes 303 and 304 along the "X" crystallographic axis of the wafer. It will be appreciated therefore that the coupling bars 309 and 310 are parallel to the coupling gap, $\Delta c$, which according to the present embodiment, is parallel to the "X" crystallographic axis of the wafer 300. Conversely, the coupling bars 309 and 310 maintain an orthogonal relationship with respect to the separation gap, $\Delta s$, which according to the present embodiment, is parallel to the "Z'" crystallographic axis of the wafer 300. According to the preferred embodiment, optimal separation gap length is within a range of 1.0 to 14.0 mils. Additionally, each coupling bar connection occurs along the first surface of the wafer.

Further investigation will reveal that the coupling bar dimensions are substantially less than the dimensions of the electrodes to which they attach. During operation, therefore, the coupling bars 309, 310, will have a higher resonating frequency than the input and output electrodes. In addition to a higher resonating frequency, the coupling bars have a higher impedance than the input or output electrodes. As a results, the coupling bar 309 has little to no effect on the midband electrical characteristics of the input electrode pairs 301, 305 and 302, 306. The same is true of coupling bar 310 and the output electrode pairs 303, 307 and 304, 308. Consequently, the optimal spurious response design parameters possessed by the input and output electrode pairs are not compromised by the addition of the thin coupling bar 309 or 310.

The true benefit of the thin coupling bar 309 and 310 is that it increases the relative surface area of an input or output electrode plurality, thereby decreasing the electrodes motional inductance, which in turn reduces the filter's overall impedance. As previously mentioned, the surface area of an electrode greatly effects the filter's attenuation characteristics as well as the overall impedance of the monolithic crystal filter. By experimentation and analysis, it has been shown that the smaller an electrode's surface area, the higher the filter impedance. Conversely, the larger the electrode surface area, the smaller the filter's impedance. By placing thin coupling bars between a plurality of input or output electrodes per FIG. 3, the motional inductance of each electrode is connected in paralle. Parallel inductance, like parallel resistance, results in a value less than the sum of its parts. The greater number of electrodes connected in this way, the greater the reduction in filter impedance.

Since it is an object of the present invention to provide a wide-bandwidth monolithic crystal filter that possesses low impedance, a thin coupling bar is placed between a plurality of electrodes possessing optimal spurious response designs. When operated in the fifth overtone mode, the disclosed monolithic crystal filter exhibits a wide passband due to the effects of multicoupling. In addition, the utilization of the thin coupling bar, connecting the respective electrodes in parallel, reduces the filter's impedance without disturbing spurious response design parameters. As a results, a wide-bandwidth low impedance monolithic crystal filter supportive of fifth overtone operation is achieved.

Referring to FIG. 4, another monolithic crystal filter embodying the present invention is shown. This monolithic crystal filter operates in accordance with the description of FIG. 3, except that the coupling gap axis of coupling and the separation gap axis of coupling are interchanged.

In a similar fashion FIG. 5 shows still another monolithic crystal filter embodying the present invention. Briefly described, the filter includes a wafer 500 which is comprised of a piezoelectric material, such as quartz. The thickness of the quartz wafer 500 determines its fundamental resonating frequency. Disposed on the first surface of the quartz wafer 500 are first and second pairs of juxtaposed electrodes 501, 502, and 503, 504, having input or output terminals designated as INPUT or OUTPUT, which may be coupled to receive and provide input and output signals, respectively. In the preferred embodiment, the wafer 500 is AT cut quartz crystal on which the juxtaposed electrode pairs may be aligned either along the "X" or "Z'" crystallographic axes of the quartz wafer as shown.

The monolithic crystal filter of FIG. 5 further includes coupling bars 509 and 510. Coupling bar 509 conductively couples the first pair of juxtaposed electrodes 501, 502, together, while coupling bar 510 conductively couples the second pair of juxtaposed electrodes 503, 504, together. As previously discussed, coupling bars 509 and 510, like coupling bars 309 and 310 of FIG. 3, have smaller dimensions than do the electrodes to which they attach. Due to their smaller dimensions, coupling bars 509 and 510 have a higher resonating frequency and a higher impedance than do the electrodes to which they attach, and thus have little to no overall effect on the mid band electrical characteristics of the individual electrodes 501, 502, 503 or 504.

Each electrode 501, 502, 503 and 504 is designed to provide 5th order overtone modes of operation, in addition to providing an optimal spurious rejection response, described by $W/L = 1.145$. While coupling bars 509 and 510 have little to no overall effect on the mid band electrical characteristics of the individual electrodes, they do operate to increase the relative surface area of the electrode pairs 501, 502 and 503, 504, due to the electroacoustical coupling between the electrode pairs, across the separation gap, $\Delta s$, bridged by coupling bars 509 and 510. Consequently, the individual electrodes 501, 502, 503 and 504 maintain 5th order overtone modes of operation and optimal spurious rejection responses, while the electrode pairs 501, 502 and 503, 504, benefit from the advantages associated with larger electrode surface areas and reduced motional inductance.

The embodiment depicted in FIG. 5 operates in accordance with the description of FIG. 3, except that disposed on the second surface of the wafer 500 is a single electrode 507, opposite to the pair of juxtaposed electrodes on the first surface of the wafer 500. Briefly described, the filter includes a wafer 500 which is comprised of a piezoelectric material, such as quartz. The thickness of the quartz wafer 500 determines its fundamental resonating frequency. Disposed on the first surface of the quartz wafer 500 are first and second pairs of juxtaposed electrodes 501, 502, and 503, 504, having input or output terminals designated as INPUT or OUTPUT, which may be coupled to receive and provide input and output signals, respectively. In the preferred embodiment, the wafer 500 is AT cut quartz crystal on which the juxtaposed electrode pairs may be aligned either along the "X" or "Z'" crystallographic axes of the quartz wafer as shown.

The monolithic crystal filter of FIG. 5 further includes coupling bars 509 and 510. Coupling bar 509 conductively couples the first pair of juxtaposed electrodes 501, 502, together, while coupling bar 510 conductively couples the second pair of juxtaposed electrodes 503, 504, together. The coupling bars 509 and 510, preferably have smaller dimensions than the juxtaposed electrodes to which they attach. Accordingly, coupling bars 509 and 510 are thinner, less than 1500 Angstroms, and have a smaller width than do the electrodes 501, 502, 503 and 504. As previously discussed, however, coupling bar lengths may be within the range of 1.0 to 14.0 mils.

Due to the face of their smaller thickness and width dimensions, coupling bars 509 and 510 have a higher resonating frequency than do the juxtaposed electrodes. In addition to their frequency being higher, the coupling bars 509 and 510 also have a higher impedance than do the electrodes to which they attach, and thus have little to no overall effect on the midband electrical characteristics of the individual electrodes 501, 502, 503 or 504.

Each electrode 501, 502, 503 and 504 is designed to provide 5th order overtone modes of operation, in addition to providing an optimal spurious rejection response, described by $W/L = 1.145$. While coupling bars 509 and 510 have little to no overall effect on the mid band electrical characteristics of the individual electrodes, they do operate to increase the relative surface area of the electrode pairs 501, 502 and 503, 504, due to the electroacoustical coupling between the electrode pairs, across the separation gap, $\Delta s$, bridged by coupling bars 509 and 510. Consequently, the individual electrodes 501, 502, 503 and 504 maintain 5th order overtone modes of operation and optimal spurious rejection responses, while the electrode pairs 501, 502 and 503, 504, benefit from the advantages associated with larger electrode surface areas and reduced motional inductance.

The embodiment depicted in FIG. 5 operates in accordance with the description of FIG. 3, except that disposed on the second surface of the wafer 500 is a single electrode 507, opposite to the pair of juxtaposed electrodes on the first surface of the wafer 500.

This embodiment provides an even larger coupling coefficient at a given gap size, but at the expense of a degraded spurious response.

Figure 6:
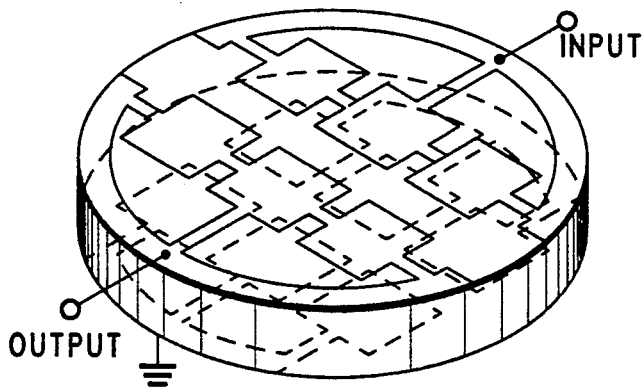
FIG. 6 shows yet another monolithic crystal filter embodying the present invention.

FIG. 6 shows yet another monolithic crystal filter embodying the present invention. This embodiment operates in accordance with the description of FIG. 3, except that a greater number of electrodes are disposed on the first and second surfaces of the crystal wafer. FIG. 6 depicts a monolithic crystal filter design in which a greater reduction in the filter's impedance is sought.

Figure 7:
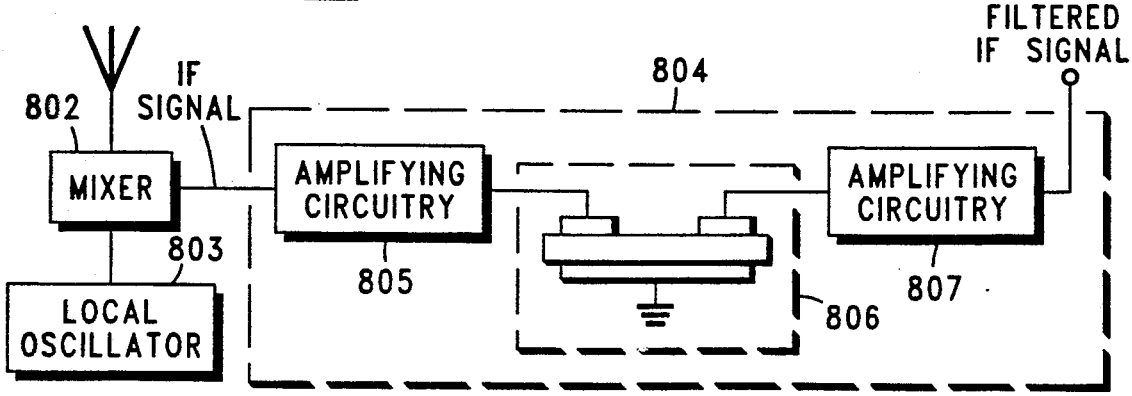
FIG. 7 is a block diagram of a portion of a radio receiver that may advantageously utilize a monolithic crystal filter embodying the present invention.

A monolithic crystal filter embodying the present invention may be advantageously utilized in any application requiring operation in the VHF range of frequencies, a wide passband and a high degree of attenuation of signals outside the passband, and low filter impedance. For example, the monolithic crystal filter of the present invention may be used in the IF portion of the radio receiver illustrated in FIG. 7. Such radio receivers may have an IF portion that operates on at frequencies above 100 MHz. In the FM receiver 800 in FIG. 7, mixer 802 combines the received signal from an antenna with a signal from the local oscillator 803 to provide an IF signal. However, the IF signal from the mixer must be filtered by the IF filter 804 to remove unwanted harmonic signals produced by the signal multiplication in the mixer 802. IF filter 804 may include amplifying and impedance matching circuitry 805 which receives and amplifies the signal prior to application to the disclosed monolithic crystal filter 806. The FILTERED IF SIGNAL from the disclosed monolithic crystal filter 806 may then be coupled to impedance matching and amplifying circuitry 807 prior to application to succeeding receiver stages. For such applications, a monolithic crystal filter embodying the present invention may be arranged to provide fifth overtone operation at an IF frequency in excess of 120 MHz, having a bandpass in excess of 30 KHz, which maintains a minimum of 50 dB of attenuation of signals at least 75 KHz away from the passband center frequency, Fc. Additionally, this filter is capable of spurious responses of more than 35 dB below the passband reference level. It should be understood that the the monolithic crystal filter of the present invention may be utilized in any FM radio requiring IF filtering in the VHF range of frequencies.

While only particular embodiments of the invention have been shown and described herein, it will be obvious that additional modifications may be made without departing from the spirit of this invention. It is therefore not intended that this invention be limited, except as indicated by the appended claims.

What is claimed is:

1. An improved wide-bandwidth monolithic crystal filter having a predetermined pass band and pass band center frequency comprising:

a crystal wafer having a first and a second flat parallel surface;

a plurality of input electrodes, having an input terminal, and disposed on the first surface of the wafer, the plurality of input electrodes conductively coupled together via a first coupling means, wherein said first coupling means is separate and apart from said input terminal;

a plurality of output electrodes, having an output terminal, and disposed on the first surface of the wafer, the plurality of output electrodes conductively coupled together via a second coupling means, wherein said second coupling means is separate and apart from said output terminal;

the plurality of input electrodes electroacoustically coupled to the plurality of output electrodes across a coupling gap therebetween; and a plurality of electrodes disposed on the second surface of the wafer in opposing relationship with said plurality of input and output electrodes.

2. The monolithic crystal filter of claim 1 wherein the crystal wafer is AT cut quartz, and the plurality of input electrodes are predeterminedly spaced from the plurality of output electrodes across the coupling gap.

3. The monolithic crystal filter of claim 1 wherein electroacoustic coupling is achieved between the plurality of output electrodes across a separation gap between each conductively coupled output electrode.

4. The monolithic crystal filter of claim 1 wherein the first coupling means connects the plurality of input electrodes in parallel and the second coupling means connects the plurality of output electrodes in parallel, thereby decreasing the overall filter impedance.

5. The monolithic crystal filter of claim 1 wherein the each coupling means is a coupling bar.

6. The monolithic crystal filter of claim 1 wherein the plurality of input electrodes and the plurality of output electrodes each have rectangular shapes.

7. The monolithic crystal filter of claim 1 wherein the plurality of input and output electrodes are respectively dimensioned and located so as to provide a filter pass band center frequency in excess of 120 MHz and a filter pass band of at least 30 KHz.

8. The monolithic crystal filter of claim 1 wherein the coupling gap is less than 4.0 mils wide.

9. The monolithic crystal filter of claim 1 wherein electroacoustic coupling is achieved between the plurality of input electrodes, across a separation gap between each conductively coupled input electrode.

10. The monolithic crystal filter of claim 9 wherein the separation gap width is within a range of 1.0 to 14.0 mils.

11. The monolithic crystal filter of claim 1 wherein the first and second coupling means are disposed on the first surface of the wafer and are perpendicular to the separation gap.

12. The monolithic crystal filter of claim 1 wherein the first and second coupling means are respectively dimensioned so as to have a resonating frequency that is greater than the pass band center frequency.

13. The monolithic crystal filter of claim 1 wherein the first and second coupling means are disposed on the first surface of the wafer and are parallel to the coupling gap.

14. An improved wide-bandwidth monolithic crystal filter having a pass band of at least 30 Khz and pass band center frequency greater than 120 Mhz and capable of providing fifth order overtone operation in an RF receiver having an IF portion for developing an IF signal from received RF signals, comprising:

a crystal wafer having a first and a second flat parallel surface;

a first pair of juxtaposed electrodes, having an input terminal, disposed on the first surface of the wafer, the first pair of juxtaposed electrodes conductively coupled together via a first coupling bar and electroacoustically coupled together across a separation gap therebetween, wherein said first coupling bar is separate and apart from said input terminal;

at least a second pair of juxtaposed electrodes, having an output terminal, disposed on the first surface of the wafer, the second pair of juxtaposed electrodes conductively coupled together via a second coupling bar and electroacoustically coupled together across a separation gap therebetween, wherein said second coupling bar is separate and apart from said output terminal;

the first pair of juxtaposed electrodes electroacoustically coupled to the second pair of juxtaposed electrodes across a coupling gap therebetween; and at least one electrode disposed on the second flat surface of the wafer opposite said first and second pair of juxtaposed electrodes;

whereby the first coupling bar connects the first pair of juxtaposed electrodes in parallel, while the second coupling bar connects the second pair of juxtaposed electrodes in parallel, thereby decreasing the filter's impedance.

15. The monolithic crystal filter of claim 14 wherein the first and second pair of juxtaposed electrodes are respectively dimensioned and located so as to provide a pass band center frequency in excess of 120 MHz and a pass band of at least 30 KHz.

16. The monolithic crystal filter of claim 14 wherein the first and second coupling bars are disposed on the first surface of the wafer, parallel to the coupling gap and perpendicular to the separation gap.

17. An improved wide-bandwidth monolithic crystal filter having a predetermined pass band and pass band center frequency comprising:

a crystal wafer having a first and a second flat parallel surface;

a plurality of input electrodes, having an input terminal, and disposed on the first surface of the wafer, the plurality of input electrodes conductively coupled together via a first coupling bar and electroacoustically coupled together across a separation gap therebetween, wherein said first coupling bar is separate and apart from said input terminal;

a plurality of output electrodes, having an output terminal, and disposed on the first surface of the wafer, the plurality of output electrodes conductively coupled together via a second coupling bar and electroacoustically coupled together across a separation gap therebetween, wherein said second coupling bar is separate and apart from said output terminal;

the plurality of input electrodes electroacoustically coupled to the plurality of output electrodes across a coupling gap therebetween; and a plurality of electrodes disposed on the second surface of the wafer in opposing relationship with said plurality of input and output electrodes.

18. The monolithic crystal filter of claim 17 wherein the plurality of input electrodes are aligned along at least one of:

a "Z'" crystallographic axis of the wafer, and a "X" crystallographic axis of the wafer.

19. The monolithic crystal filter of claim 17 wherein the plurality of output electrodes are aligned along at least one of:

a "Z'" crystallographic axis of the wafer, and a "X" crystallographic axis of the wafer.

20. The monolithic crystal filter of claim 17 wherein the crystal wafer is AT cut quartz, and the plurality of input electrodes are predeterminedly spaced from the plurality of output electrodes across the coupling gap.

21. The monolithic crystal filter of claim 17 wherein the plurality of input and output electrodes are respectively dimensioned and located so as to provide a pass band center frequency in excess of 120 MHz and a pass band of at least 30 KHz.

22. The monolithic crystal filter of claim 17 wherein each coupling bar is disposed on the first surface of the wafer, perpendicular to the separation gap.

23. The monolithic crystal filter of claim 17 wherein the first and second coupling bars have a resonating frequency that is greater than the pass band center frequency.

24. The monolithic crystal filter of claim 17 wherein the first coupling bar connects the plurality of input electrodes in parallel and the second coupling bar connects the plurality of output electrodes in parallel, thereby decreasing the overall filter impedance.

25. The monolithic crystal filter of claim 17 wherein each coupling bar is disposed on the first surface of the wafer, parallel to the coupling gap.

26. An improved wide-bandwidth monolithic crystal filter having a predetermined pass band and pass band center frequency, disposed within an RF receiver having an IF portion for developing an IF signal from received RF signals, comprising:

a crystal substrate having a first and a second flat parallel surface constituting opposite surfaces of the substrate;

first electrode means, including a first pair of electrodes, disposed on the opposite surfaces of the substrate, each electrode of the first pair having an external lead;

second electrode means, including a second pair of electrodes, disposed on the opposite surfaces of the substrate at a predetermined distance from the first electrode means, each electrode of the second pair having an external lead, the second electrode means conductively coupled to the first electrode means via a first coupling bar disposed therebetween and electroacoustically coupled to the first electrode means across a separation gap bridged by the first coupling bar, wherein said first coupling bar is separate and apart from said external leads associated with the first and second pair of electrodes;

third electrode means, including a third pair of electrodes, disposed on the opposite surfaces of the substrate at a predetermined distance from the first electrode means, each electrode of the third pair having an external lead; and at least a fourth electrode means, including a fourth pair of electrodes, disposed on the opposite surfaces of the substrate at a predetermined distance from the second and third electrode means, each electrode of the at least fourth pair of electrodes having an external lead, the at least fourth electrode means conductively coupled to the third electrode means via a second coupling bar disposed therebetween and electroacoustically coupled to the third electrode means across a separation gap bridged by the second coupling bar, wherein said second coupling bar is separate and apart from said external leads associated with the third and fourth pair of electrodes;

said electrode means being arranged so that the first and second electrode means are electroacoustically coupled to the third and fourth electrode means across a coupling gap therebetween.

27. The monolithic crystal filter of claim 26 wherein the crystal wafer is AT cut quartz and each electrode of the first, second, third, and fourth electrode means is respectively dimensioned and located so as to provide a pass band center frequency in excess of 120 MHz and a pass band of at least 30 KHz.

28. The monolithic crystal filter of claim 26 wherein the first and second coupling bars have a resonating frequency that is greater than the pass band center frequency;

29. The monolithic crystal filter of claim 26 wherein the first coupling bar connects the first and second electrode means in parallel and the second coupling bar connects the third and fourth electrode means in parallel, thereby decreasing the overall filter impedance.

30. The monolithic crystal filter of claim 26 wherein each coupling bar is disposed on the first surface of the wafer, parallel to the coupling gap and orthogonal to the separation gap.

* * * * *